(12) United States Patent
Hino

(10) Patent No.: US 12,464,819 B2
(45) Date of Patent: Nov. 4, 2025

(54) SEMICONDUCTOR INTEGRATED CIRCUIT DEVICE

(71) Applicant: Socionext Inc., Kanagawa (JP)

(72) Inventor: Toshio Hino, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 419 days.

(21) Appl. No.: 18/319,912

(22) Filed: May 18, 2023

(65) Prior Publication Data

US 2023/0290785 A1    Sep. 14, 2023

Related U.S. Application Data

(63) Continuation of application No. PCT/JP2021/046029, filed on Dec. 14, 2021.

(30) Foreign Application Priority Data

Dec. 25, 2020 (JP) .................. 2020-216641

(51) Int. Cl.
 *H10D 84/90* (2025.01)
 *H10D 89/10* (2025.01)

(52) U.S. Cl.
 CPC ........... *H10D 84/907* (2025.01); *H10D 89/10* (2025.01); *H10D 84/981* (2025.01)

(58) Field of Classification Search
 CPC .... H10D 84/907; H10D 89/10; H10D 84/981; H10D 84/01
 See application file for complete search history.

(56) References Cited

U.S. PATENT DOCUMENTS

| | | | |
|---|---|---|---|
| 6,849,906 B2* | 2/2005 | Maeno | H10D 84/907 |
| | | | 257/390 |
| 2008/0169487 A1* | 7/2008 | Shimbo | H10D 89/10 |
| | | | 257/E27.07 |
| 2009/0195282 A1* | 8/2009 | Tatsumi | H10D 89/10 |
| | | | 327/175 |
| 2018/0151494 A1* | 5/2018 | Ohtou | H10D 84/0186 |
| 2018/0190640 A1* | 7/2018 | Shimbo | H10D 89/10 |
| 2019/0080969 A1* | 3/2019 | Tsao | H01L 21/76224 |
| 2021/0082815 A1* | 3/2021 | Doornbos | H01L 23/5286 |
| 2021/0375863 A1 | 12/2021 | Komuro et al. | |
| 2022/0045215 A1 | 2/2022 | Takeno et al. | |

FOREIGN PATENT DOCUMENTS

| | | |
|---|---|---|
| WO | 2020/170715 A1 | 8/2020 |
| WO | 2020/217400 A1 | 10/2020 |

OTHER PUBLICATIONS

International Search Report (ISR) dated Feb. 15, 2022 issued in International Patent Application No. PCT/JP2021/046029, with English translation.

* cited by examiner

*Primary Examiner* — S M Sohel Imtiaz
(74) *Attorney, Agent, or Firm* — Rimon P.C.

(57) ABSTRACT

In a semiconductor integrated circuit device, a cell having no logical function placed in an end row of a plurality of cell rows includes: a third transistor opposed to a transistor of a cell adjacent in the Y direction; a third buried power line supplying VSS placed on the same side of the third transistor as the transistor of the adjacent cell; and a fourth buried power line supplying VDD placed on the opposite side of the third transistor from the transistor of the adjacent cell. The fourth buried power line is greater in size in the Y direction than the third buried power line.

10 Claims, 11 Drawing Sheets

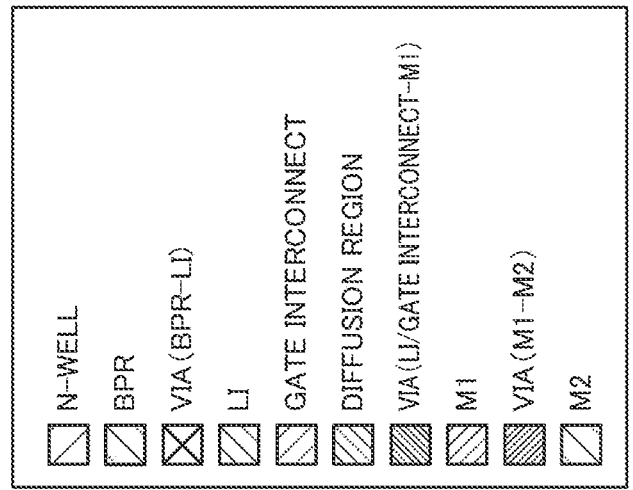
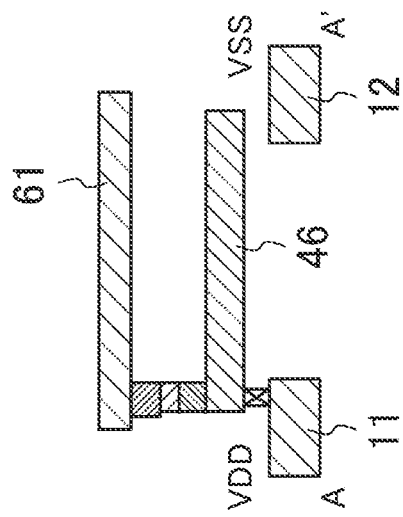
FIG.2A
POWER TAP CELL
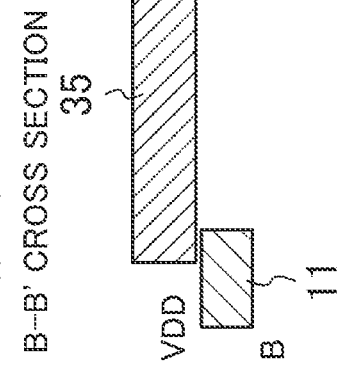
FIG.2B
A-A' CROSS SECTION
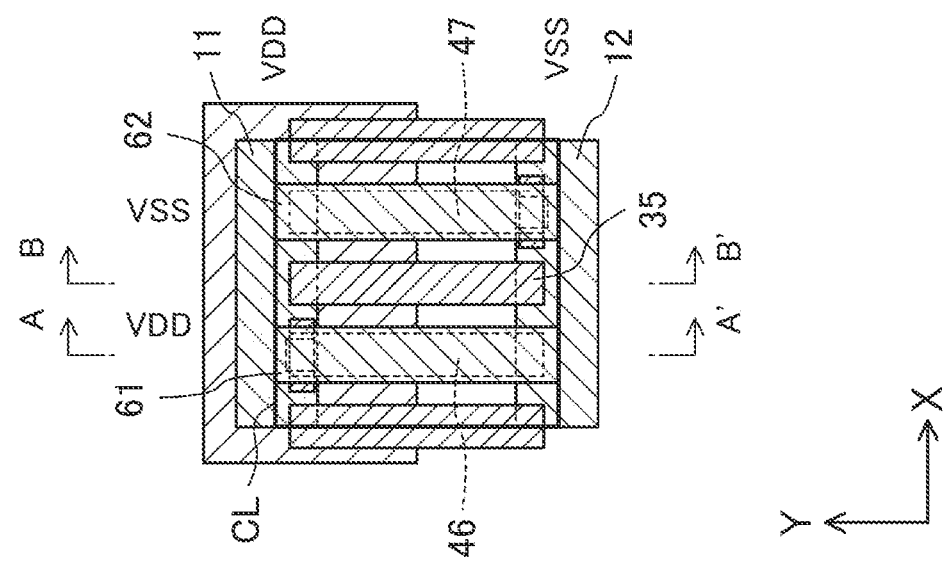
FIG.2C
B-B' CROSS SECTION

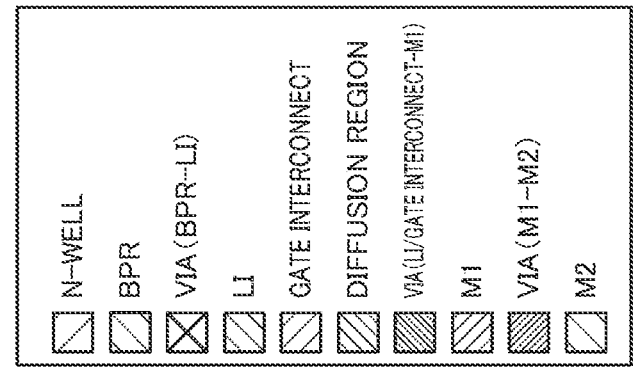
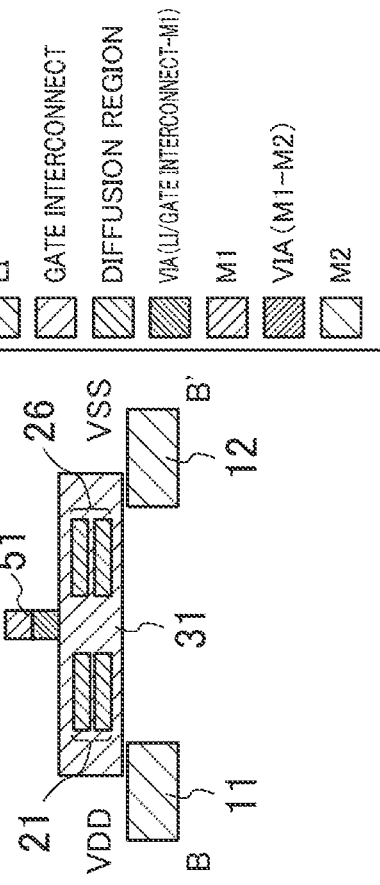
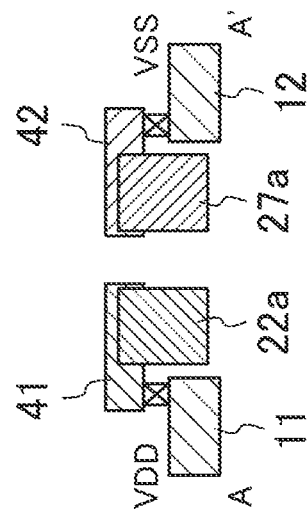
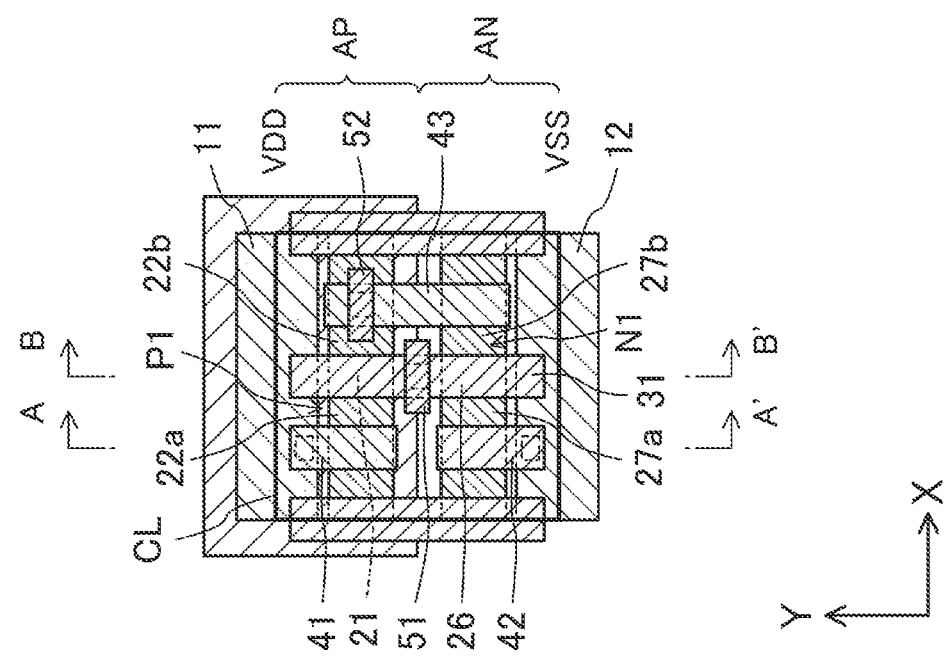

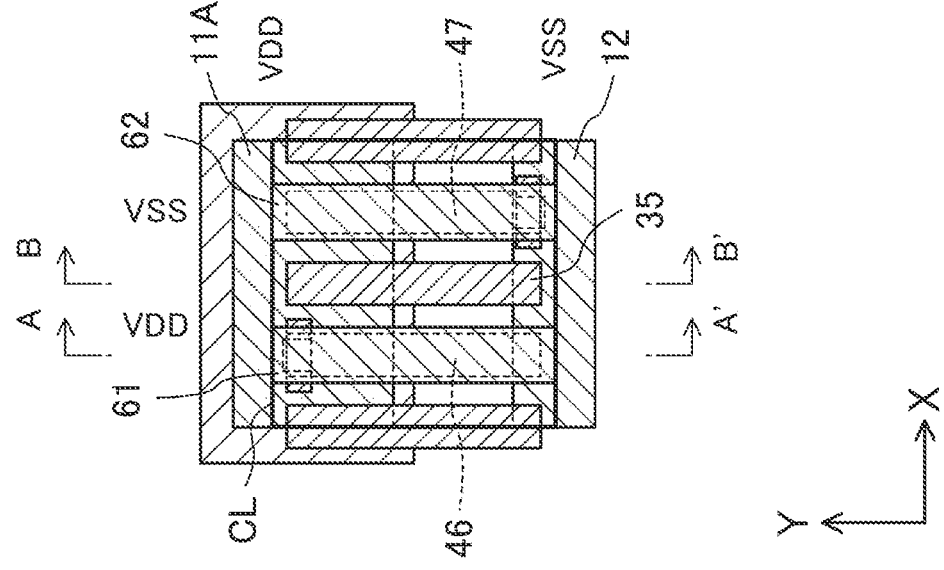
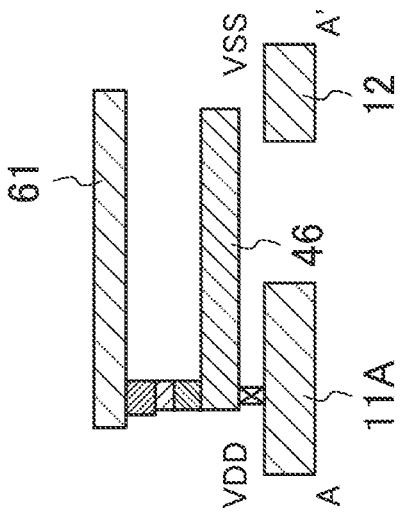
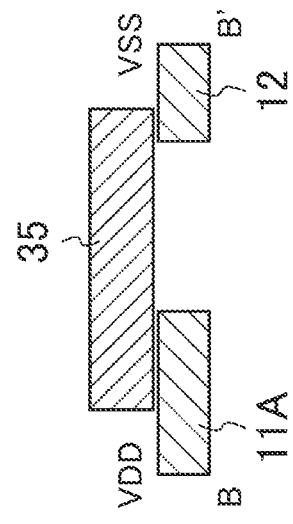
FIG.4A END-ROW POWER TAP CELL
FIG.4B A-A' CROSS SECTION
FIG.4C B-B' CROSS SECTION

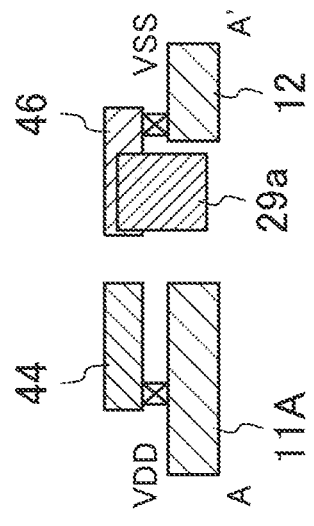
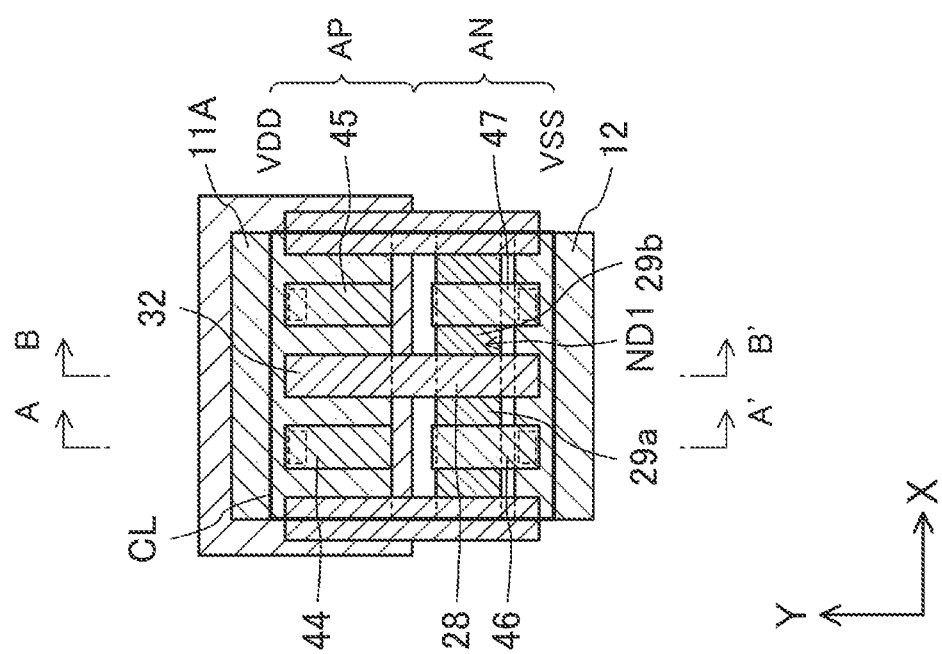

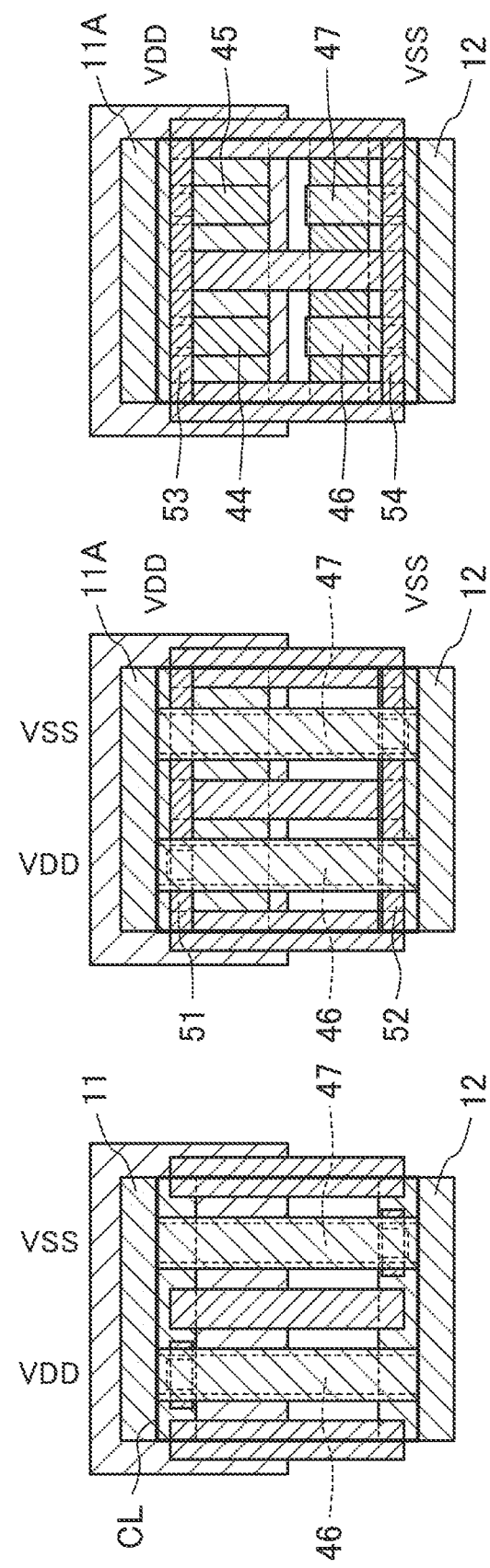

END-ROW POWER TAP CELL

TERMINAL CELL

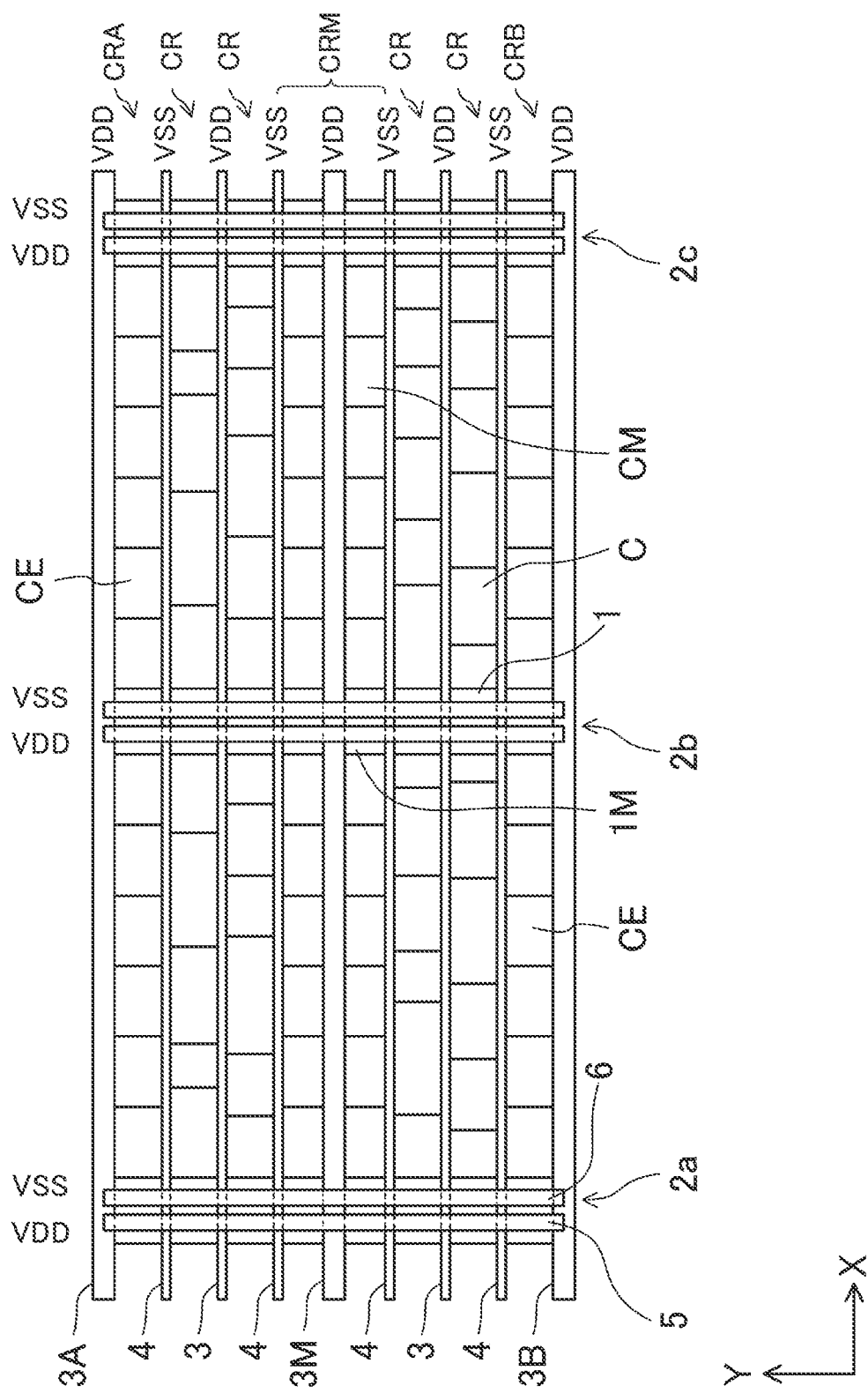

POWER TAP CELL 1M

CELL CM

POWER TAP CELL 1M

CELL CM

POWER TAP CELL

CELL

SEMICONDUCTOR INTEGRATED CIRCUIT DEVICE

CROSS-REFERENCE TO RELATED APPLICATIONS

This is a continuation of International Application No. PCT/JP2021/046029 filed on Dec. 14, 2021, which claims priority to Japanese Patent Application No. 2020-216641 filed on Dec. 25, 2020. The entire disclosures of these applications are incorporated by reference herein.

BACKGROUND

The present disclosure relates to a semiconductor integrated circuit device provided with standard cells.

As a method for forming a semiconductor integrated circuit on a semiconductor substrate, a standard cell method is known. The standard cell method is a method in which basic units (e.g., inverters, latches, flipflops, and full adders) having specific logical functions are prepared in advance as standard cells, and a plurality of such standard cells are placed on a semiconductor substrate and connected through lines, thereby designing an LSI chip.

Also, for higher integration of a semiconductor integrated circuit device, it is proposed to use, for standard cells, buried power rails (BPRs) that are power lines laid in a buried interconnect layer, not power lines laid in a metal interconnect layer formed above transistors as conventionally done.

U.S. Patent Application Publication No. 2019/0080969 (FIG. 1E) discloses a configuration of a block constituted by standard cells, in which buried power rails are used and connected to sources of transistors and further connected to power lines laid in an upper interconnect layer.

Since buried power rails are buried in a substrate, they cannot be formed in a region where the source, drain, and channel of each transistor are present. For this reason, if the buried power rails are made thick to strengthen power lines for prevention of a power supply voltage drop, this will lead to increase in the area of the standard cell, resulting in interfering with achievement of higher integration of the semiconductor integrated circuit.

An objective of the present disclosure is permitting strengthening of power lines without interfering with achievement of higher integration in a semiconductor integrated circuit device using buried power lines.

SUMMARY

According to the first mode of the present disclosure, a semiconductor integrated circuit device includes a plurality of cell rows each including standard cells lining up in a first direction, the cell rows being arranged in a second direction perpendicular to the first direction, wherein the plurality of cell rows include a first standard cell having a logical function placed in a first cell row, the first cell row being a row located second from an end row in the second direction, and a second standard cell having no logical function placed in a second cell row, the second cell row being the end row in the second direction and adjoining the first cell row, the second standard cell being adjacent to the first standard cell in the second direction, the first standard cell includes a first region in which a transistor of a first conductivity type is formed, a second region in which a transistor of a second conductivity type is formed, a first transistor of the first conductivity type formed in the first region, a second transistor of the second conductivity type formed in the second region, a first buried power line supplying a first power supply voltage, formed in a buried interconnect layer, and a second buried power line supplying a second power supply voltage, formed in the buried interconnect layer, the second standard cell includes a third region in which a transistor of the second conductivity type is formed, a third transistor of the second conductivity type formed in the third region, opposed to the second transistor in the second direction, a third buried power line supplying the second power supply voltage, formed in the buried interconnect layer and placed on a same side of the third transistor as the second transistor, and a fourth buried power line supplying the first power supply voltage, formed in the buried interconnect layer and placed on an opposite side of the third transistor from the second transistor, and the size of the fourth buried power line in the second direction is greater than the size of the third buried power line in the second direction.

According to the above mode, a second standard cell having no logical function is placed in a second cell row that is an end row of a plurality of cell rows. The second standard cell is adjacent to a first standard cell having a logical function in the second direction. The second standard cell includes a third transistor opposed to a second transistor of the first standard cell, a third buried power line supplying a second power supply voltage, and a fourth buried power line supplying a first power supply voltage. The third buried power line is placed on the same side of the third transistor as the second transistor of the first standard cell, and the fourth buried power line is placed on the opposite side of the third transistor from the second transistor of the first standard cell. The size of the fourth buried power line in the second direction is greater than the size of the third buried power line in the second direction. With this configuration, the fourth buried power line can be thickened without increasing the area of the second standard cell in the second cell row. Therefore, in the semiconductor integrated circuit device using buried power lines, it is possible to strengthen power lines without interfering with achievement of higher integration.

According to the second mode of the present disclosure, a semiconductor integrated circuit device includes a plurality of cell rows each including standard cells lining up in a first direction, the cell rows being arranged in a second direction perpendicular to the first direction, wherein the plurality of cell rows include a first standard cell having a logical function placed in a first cell row, and a second standard cell, which is a multi-height cell, having no logical function placed in a second cell row adjoining the first cell row, the second standard cell being adjacent to the first standard cell in the second direction, the first standard cell includes a first region in which a transistor of a first conductivity type is formed, a second region in which a transistor of a second conductivity type is formed, a first transistor of the first conductivity type formed in the first region, a second transistor of the second conductivity type formed in the second region, a first buried power line supplying a first power supply voltage, formed in a buried interconnect layer, and a second buried power line supplying a second power supply voltage, formed in the buried interconnect layer, the second standard cell includes a third region in which a transistor of the second conductivity type is formed, a third transistor of the second conductivity type formed in the third region, opposed to the second transistor in the second direction, a third buried power line supplying the second power supply voltage, formed in the buried interconnect layer and placed on a same side of the third transistor as the second transistor, and a fourth buried power line supplying the first power supply voltage, formed in the buried interconnect layer and placed on an opposite side of the third transistor from the second transistor, and the size of the fourth buried power line in the second direction is greater than the size of the third buried power line in the second direction.

According to the above mode, a second standard cell, which is a multi-height cell, having no logical function is placed in a second cell row of a plurality of cell rows. The second standard cell is adjacent to a first standard cell having a logical function in the second direction. The second standard cell includes a third transistor opposed to a second transistor of the first standard cell, a third buried power line supplying a second power supply voltage, and a fourth buried power line supplying a first power supply voltage. The third buried power line is placed on the same side of the third transistor as the second transistor of the first standard cell, and the fourth buried power line is placed on the opposite side of the third transistor from the second transistor of the first standard cell. The size of the fourth buried power line in the second direction is greater than the size of the third buried power line in the second direction. With this configuration, the fourth buried power line can be thickened without increasing the area of the second standard cell in the second cell row. Therefore, in the semiconductor integrated circuit device using buried power lines, it is possible to strengthen power lines without interfering with achievement of higher integration.

According to the present disclosure, in a semiconductor integrated circuit device using buried power lines, it is possible to strengthen power lines without interfering with achievement of higher integration.

BRIEF DESCRIPTION OF THE DRAWINGS

FIGS. 2A-2C show a layout structure example of a power tap cell, where FIG. 2A is a plan view and FIGS. 2B and 2C are cross-sectional views.

FIGS. 3A-3C show a layout structure example of an inverter cell, where FIG. 3A is a plan view and FIGS. 3B and 3C are cross-sectional views.

FIGS. 4A-4C show a layout structure example of a power tap cell in an end row, where FIG. 4A is a plan view and FIGS. 4B and 4C are cross-sectional views.

FIGS. 5A-5C show a layout structure example of a terminal cell, where FIG. 5A is a plan view and FIGS. 5B and 5C are cross-sectional views.

FIG. 6A shows an alteration of the power tap cell, FIG. 6B shows an alteration of the power tap cell in an end row, and FIG. 6C shows an alteration of the terminal cell.

FIG. 9 shows a layout example of a circuit block of a semiconductor integrated circuit device according to the second embodiment.

FIG. 12A shows a power tap cell and FIG. 12B shows a cell.

DETAILED DESCRIPTION

Embodiments of the present disclosure will be described hereinafter with reference to the accompanying drawings. In the following embodiments, it is assumed that the semiconductor integrated circuit device includes a plurality of standard cells (hereinafter simply called cells as appropriate) and at least some of the standard cells include nanosheet field effect transistors (FETs). The nanosheet FET is a FET using a thin sheet (nanosheet) through which a current flows. Such a nanosheet is formed of silicon, for example. Also, in the present disclosure, a semiconductor layer portion formed at each end of a nanosheet to constitute a terminal that is to be the source or drain of a nanosheet FET is called a "pad."

In the present disclosure, "VDD" and "VSS" refer to the power supply voltages or the power supplies themselves. Also, hereinafter, in the plan views such as FIG. 1, the horizontal direction in the figure is called an X direction (corresponding to the first direction), the vertical direction in the figure is called a Y direction (corresponding to the second direction), and the direction perpendicular to the substrate plane is called a Z direction.

First Embodiment

Figure 1:
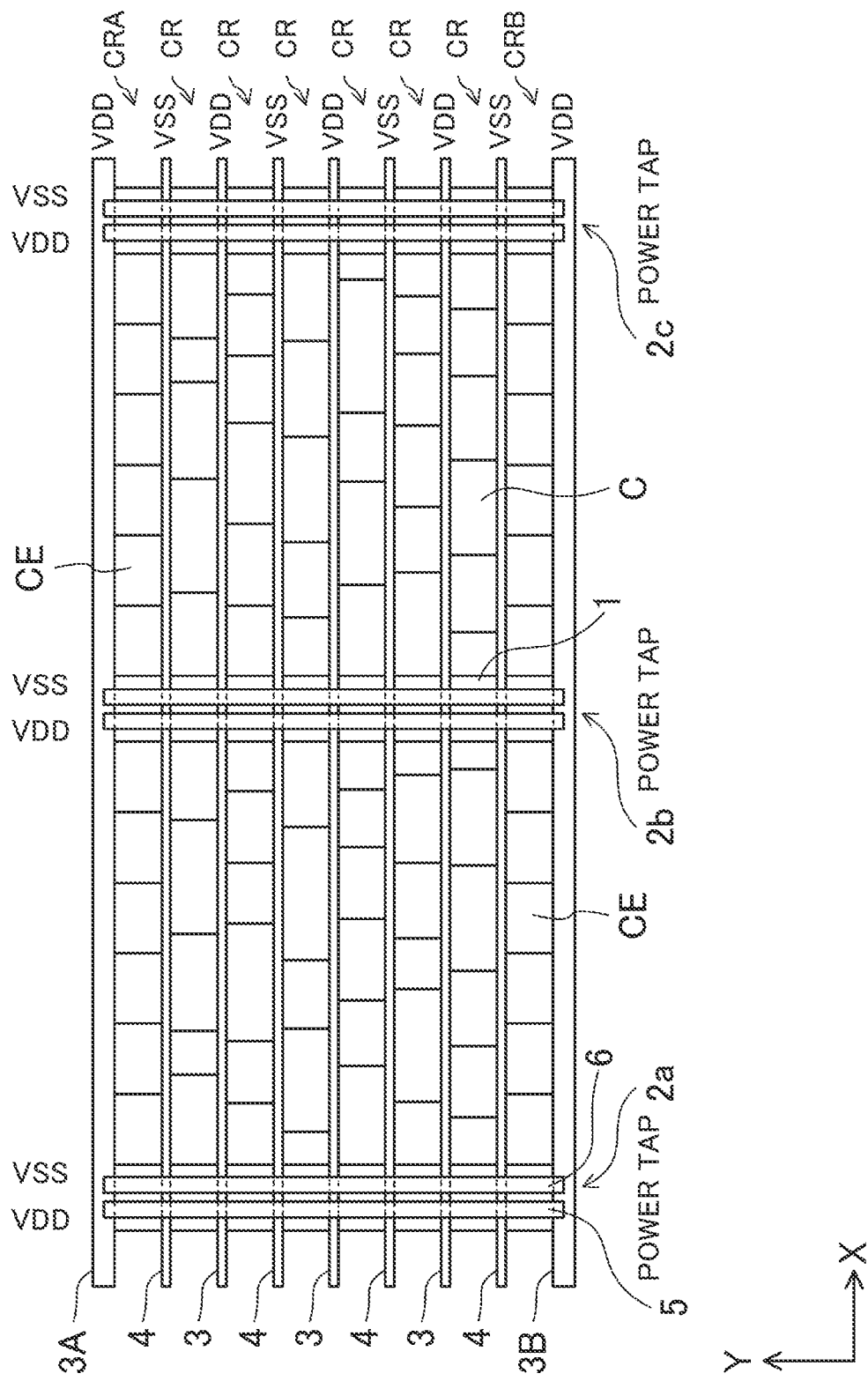
FIG. 1 shows a layout example of a circuit block of a semiconductor integrated circuit device according to the first embodiment.

FIG. 1 shows a layout example of a circuit block of a semiconductor integrated circuit device according to the first embodiment. In the layout of FIG. 1, a plurality of cell rows CR each including standard cells C lining up in the X direction are arranged in the Y direction. Each of the standard cells C includes a nanosheet FET, for example. The cell rows CR are inverted vertically (in the Y direction) every other row. Power lines 3 supplying the power supply voltage VDD and power lines 4 supplying the power supply voltage VSS are placed alternately to lie between the adjacent cell rows CR. The power lines 3 and 4 are buried power rails (BPRs) formed in a buried interconnect layer. The cells C in the cell rows CR receive VDD and VSS from the power lines 3 and 4 placed on their upper and lower sides in the figure.

Terminal cells CE are arranged to line up in the X direction in the cell rows along both ends of the circuit block in the Y direction, i.e., the uppermost cell row CRA and the lowermost cell row CRB in the figure. The "terminal cell" is a type of cell having no logical function, which does not contribute to the logical functions of the circuit block but is used to terminate the circuit block. With placement of such terminal cells, it is possible to reduce variations in the finished shape of the layout pattern of cells lying on the inner side of the terminal cells, and this can lead to reduction in production variations of semiconductor integrated circuit devices, improvement in yield, and improvement in reliability.

In the cell rows CR, CRA, and CRB, power tap cell groups 2a, 2b, and 2c each including a plurality of power tap cells 1 are placed at equal spacing in the X direction. Each of the power tap cell groups 2a, 2b, and 2c includes a plurality of power tap cells 1 located at the same position in the X direction. M2 interconnects extending in the Y direction are laid in the power tap cells 1, and with the adjacent placement of the power tap cells 1 in the Y direction, formed are M2 power lines 5 and 6 extending in the Y direction in the circuit block. The M2 power line 5 is connected with the power lines 3 supplying VDD through vias in the power tap cells 1. The M2 power line 6 is connected with the power lines 4 supplying VSS through vias in the power tap cells 1. As a result, a grid-like power line network is formed, whereby the power supply is strengthened.

Note that, in FIG. 1, illustration of components other than the buried power lines and the M2 power lines is omitted. The configurations of the power tap cells 1, the cells C, and the terminal cells CE will be described hereinafter.

FIGS. 2A-2C are views showing an example of the layout structure of the power tap cell 1 in the cell row CR, where FIG. 2A is a plan view, FIG. 2B is a cross-sectional view taken along line A-A' in FIG. 2A, and FIG. 2C is a cross-sectional view taken along line B-B' in FIG. 2A. In FIG. 2A, the cell limits CL of the power tap cell 1 are represented by the bold line, which also applies to the subsequent plan views. FIGS. 3A-3C are views showing an example of the layout structure of an inverter cell as an example of the cells C, where FIG. 3A is a plan view, FIG. 3B is a cross-sectional view taken along line A-A' in FIG. 3A, and FIG. 3C is a cross-sectional view taken along line B-B' in FIG. 3A.

First, referring to FIGS. 3A-3C, the layout structure of the inverter cell will be described.

As shown in FIG. 3A, power lines 11 and 12 extending in the X direction are laid along both ends of the inverter cell in the Y direction. The power lines 11 and 12 are both buried power rails (BPRs) formed in the buried interconnect layer. The power line 11 supplies the power supply voltage VDD, and the power line 12 supplies the power supply voltage VSS. The power line 11 is shared by other cells C placed in the same cell row CR as this inverter cell, forming the power line 3 in FIG. 1. The power line 12 is shared by other cells C placed in the same cell row CR as this inverter cell, forming the power line 4 in FIG. 1.

A p-type transistor P1 is formed in a p-type transistor region AP on an N-well, and an n-type transistor N1 is formed in an n-type transistor region AN on a P-substrate.

The transistor P1 has two nanosheets 21 as a channel portion. That is, the transistor P1 is a nanosheet FET. At both ends of the nanosheets 21 in the X direction, formed are pads 22a and 22b each formed of a semiconductor layer of an integral structure connected to the two sheets. The pads 22a and 22b are to be the source region and drain region of the transistor P1.

The transistor N1 has two nanosheets 26 as a channel portion. That is, the transistor N1 is a nanosheet FET. At both ends of the nanosheets 26 in the X direction, formed are pads 27a and 27b each formed of a semiconductor layer of an integral structure connected to the two sheets. The pads 27a and 27b are to be the source region and drain region of the transistor N1.

A gate interconnect 31, extending in the Y direction, surrounds the nanosheets 21 of the transistor P1 through a gate insulating film (not shown) and also surrounds the nanosheets 26 of the transistor N1 through a gate insulating film (not shown). The gate interconnect 31 is to be the gates of the transistors P1 and N1.

Local interconnects (abbreviated as LI in the FIGS. 41, 42, and 43 extending in the Y direction are formed. The local interconnect 41 is connected with the pad 22a and also connected with the power line 11 through a via. The local interconnect 42 is connected with the pad 27a and also connected with the power line 12 through a via. The local interconnect 43 is connected with the pads 22b and 27b.

M1 interconnects 51 and 52 extending in the X direction are formed in a first metal interconnect layer. The M1 interconnect 51 is connected with the gate interconnect 31 through a via. An input terminal of the inverter cell is provided on the top of the M1 interconnect 51. The M1 interconnect 52 is connected with the local interconnect 43 through a via. An output terminal of the inverter cell is provided on the top the M1 interconnect 52.

That is, the local interconnects 41, 42, and 43 are formed in a local interconnect layer located above the buried power lines and below the M1 interconnects, and are in contact with the sources or drains of the transistors P1 and N1. Also, the terminals of the cell are provided in the M1 interconnect layer, and interconnects between cells are provided in the M1 and upper interconnect layers.

Next, the layout structure of the power tap cell 1 will be described with reference to FIGS. 2A-2C.

As shown in FIG. 2A, as in the inverter cell, the power lines 11 and 12 extending in the X direction, which are both buried power rails, are laid along both ends of the power tap cell 1 in the Y direction. The power line 11 supplies the power supply voltage VDD, and the power line 12 supplies the power supply voltage VSS.

No nanosheet is formed, and thus no transistor is formed, in the power tap cell 1.

A gate interconnect 35 extends in the Y direction, and local interconnects 46 and 47 extending in the Y direction are formed on both sides of the gate interconnect 35 in the X direction. The local interconnects 46 and 47 are formed in the same local interconnect layer as the local interconnects 41, 42, and 43 of the inverter cell. The local interconnect 46 is connected with the power line 11 through a via, and the local interconnect 47 is connected with the power line 12 through a via.

M2 interconnects 61 and 62 extending in the Y direction are formed in a second metal interconnect layer. The M2 interconnect 61 overlaps the local interconnect 46 as viewed in plan and is connected with the local interconnect 46 through vias and an M1 interconnect. The M2 interconnect 62 overlaps the local interconnect 47 as viewed in plan and is connected with the local interconnect 47 through vias and an M1 interconnect. The M2 interconnects 61 and 62 extend up to the cell limits CL in the Y direction.

FIGS. 4A-4C are views showing an example of the layout structure of the power tap cell 1 in the cell row CRA that is the uppermost row of the circuit block, where FIG. 4A is a plan view, FIG. 4B is a cross-sectional view taken along line A-A' in FIG. 4A, and FIG. 4C is a cross-sectional view taken along line B-B' in FIG. 4A. FIGS. 5A-5C are views showing an example of the layout structure of a terminal cell CE in the cell row CRA, where FIG. 5A is a plan view, FIG. 5B is a cross-sectional view taken along line A-A' in FIG. 5A, and FIG. 5C is a cross-sectional view taken along line B-B' in FIG. 5A. Note that, in the cell row CRB that is the lowermost row of the circuit block, power tap cells 1 and terminal cells CE having configurations vertically inverted from those of FIGS. 4A-4C and FIGS. 5A-5C, respectively, are placed.

The power tap cell shown in FIGS. 4A-4C is roughly the same as the power tap cell shown in FIGS. 2A-2C, except that a power line 11A supplying VDD is greater in line width than the power lines 11 and 12.

The layout structure of the terminal cell CE will be described with reference to FIGS. 5A-5C.

An n-type dummy transistor ND1 is formed in the n-type transistor region AN on the P-substrate. The dummy transistor ND1 has two nanosheets 28 as a channel portion. At both ends of the nanosheets 28 in the X direction, formed are pads 29a and 29b each formed of a semiconductor layer of an integral structure connected to the two sheets. No dummy transistor is formed in the p-type transistor region AP on the N-well.

A gate interconnect 32, extending in the Y direction, surrounds the nanosheets 28 of the dummy transistor ND1 through a gate insulating film (not shown). Local interconnects 44, 45, 46, and 47 extending in the Y direction are formed. The local interconnects 44 and 45 are connected with the power line 11A through vias. The local interconnect 46 is connected with the pad 29a and also connected with the power line 12 through a via. The local interconnect 47 is connected with the pad 29b and also connected with the power line 12 through a via.

The power tap cells 1 shown in FIGS. 2A-2C and 4A-4C are placed in a line in the Y direction as shown in FIG. 1. With this placement, the M2 interconnects 61 and 62 each continue over the power tap cells 1 lining up in the Y direction, forming the M2 power lines 5 and 6 in FIG. 1. Since the M2 interconnect 61 is connected with the power line 11 through vias and an M1 interconnect and the M2 interconnect 62 is connected with the power line 12 through vias and an M1 interconnect in each power tap cell 1, the M2 power line 5 is to be connected with the power lines 3 and the M2 power line 6 is to be connected with the power lines 4.

As shown in FIGS. 5A-5C, in the terminal cell CE, the nanosheets, the pads, the gate, and the local interconnects are formed in the transistor region closer to the cell C adjacent in the Y direction (i.e., the n-type transistor region AN in the lower part in FIG. 5A). With this configuration, it is possible to reduce variations in the finished shape of the layout pattern of the cells C in the cell rows CR, and this can lead to reduction in production variations of semiconductor integrated circuit devices, improvement in yield, and improvement in reliability.

Also, in the terminal cell CE, no dummy transistor including nanosheets and pads is formed in the p-type transistor region AP. Therefore, the line width of the buried power line 11A can be extended into the inside of the terminal cell CE. That is, with no dummy transistor formed in the p-type transistor region AP, it is possible to place the thick buried power line 11A without increasing the cell area. It is therefore possible to strengthen power lines without interfering with achievement of higher integration of the semiconductor integrated circuit. Note that, since the p-type transistor region AP does not adjoin any cells C, the absence of a dummy transistor in this region will not impair the effects of reducing production variations of semiconductor integrated circuit devices, improving the yield, and improving the reliability described above.

As described above, in this embodiment, the terminal cells CE having no logical function are placed in the cell rows CRA and CRB along the ends of the circuit block. The terminal cells CE are adjacent to the cells C having normal logical functions in the Y direction. Each of the terminal cells CE includes the dummy transistor ND1 opposed to a transistor of its adjacent cell C, the buried power line 12 supplying VSS, and the buried power line 11A supplying VDD. The buried power line 12 is placed on the same side of the dummy transistor ND1 as the transistor of the cell C, and the buried power line 11A is placed on the opposite side of the dummy transistor ND1 from the transistor of the cell C. The size of the buried power line 11A in the Y direction is greater than the size of the buried power line 12 in the Y direction. With this configuration, the buried power line 11A can be thickened without increasing the area of the terminal cells CE in the cell rows CRA and CRB. Therefore, in the semiconductor integrated circuit device using buried power lines, it is possible to strengthen power lines without interfering with achievement of higher integration.

(Alteration 1)

FIG. 6A shows an alteration of the power tap cell 1 shown in FIGS. 2A-2C. In the layout structure of FIG. 6A, the local interconnects 46 and 47 extend up to the cell limits CL. Similarly, the local interconnects 46 and 47 of the power tap cell 1 shown in FIGS. 4A-4C may be extended up to the cell limits CL. With this alteration, in each of the power tap cell groups 2a, 2b, and 2c, the local interconnects 46 of the power tap cells 1 are mutually connected, and the local interconnects 47 of the power tap cells 1 are mutually connected, each forming a local power line extending in the Y direction. Therefore, since the M2 power lines and the local power lines together constitute the power line network, the power supply in the Y direction can be strengthened.

(Alteration 2)

FIG. 6B shows an alteration of the power tap cell 1 shown in FIGS. 4A-4C, and FIG. 6C shows an alteration of the terminal cell CE shown in FIGS. 5A-5C. In the layout structure of FIG. 6B, M1 interconnects 51 and 52 extend up to the cell limits CL in the X direction. The M1 interconnect 51 is connected with the power line 11A through vias and the local interconnect 46. The M1 interconnect 52 is connected with the power line 12 through vias and the local interconnect 47. In the layout structure of FIG. 6C, M1 interconnects 53 and 54 extend up to the cell limits CL in the X direction. The M1 interconnect 53 is connected with the power line 11A through vias and the local interconnects 44 and 45. The M1 interconnect 54 is connected with the power line 12 through vias and the local interconnects 46 and 47.

With the alterations of FIGS. 6B and 6C, in each of the cell rows CRA and CRB in FIG. 1, the M1 interconnects 51 of the power tap cells 1 and the M1 interconnects 53 of the terminal cells CE are mutually connected, and the M1 interconnects 52 of the power tap cells 1 and the M1 interconnects 54 of the terminal cells CE are mutually connected, each forming an M1 power line extending in the X direction. Therefore, since the M1 power lines and the buried power lines together constitute the power line network, the power supply in the X direction can be strengthened.

Note that, in FIGS. 6B and 6C, the M1 interconnects 51 to 54 may be replaced with multilayered interconnects.

(Alteration 3)

Figure 7A:
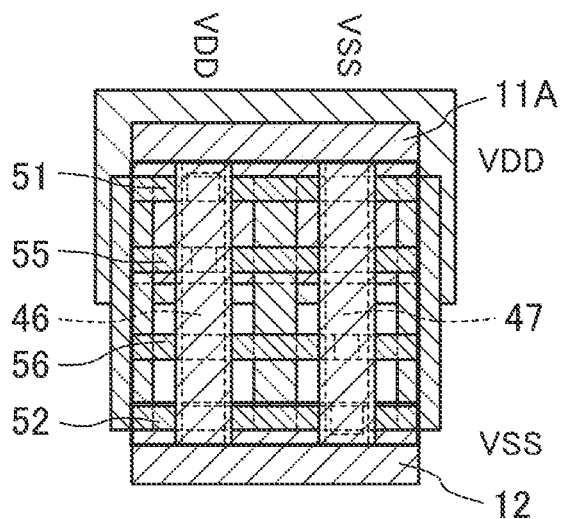
FIG. 7A shows an alteration of the power tap cell in an end row.
Figure 7B:
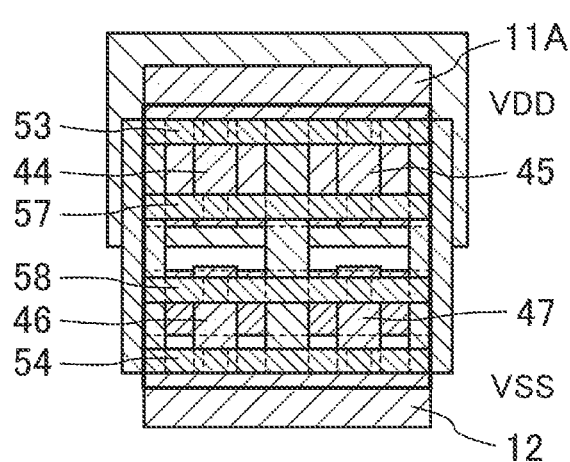
FIG. 7B shows an alteration of the terminal cell.

FIG. 7A shows a further alteration of the power tap cell 1 shown in FIG. 6B, and FIG. 7B shows a further alteration of the terminal cell CE shown in FIG. 6C. In the layout structure of FIG. 7A, M1 interconnects 55 and 56 extending up to the cell limits CL in the X direction are added. The M1 interconnect 55 is connected with the power line 11A through vias and the local interconnect 46. The M1 interconnect 56 is connected with the power line 12 through vias and the local interconnect 47. In the layout structure of FIG. 7B, M1 interconnects 57 and 58 extending up to the cell limits CL in the X direction are added. The M1 interconnect 57 is connected with the power line 11A through vias and the local interconnects 44 and 45. The M1 interconnect 58 is connected with the power line 12 through vias and the local interconnects 46 and 47.

With the alterations of FIGS. 7A and 7B, in each of the cell rows CRA and CRB in FIG. 1, the M1 interconnects 55 of the power tap cells 1 and the M1 interconnects 57 of the terminal cells CE are mutually connected, and the M1 interconnects 56 of the power tap cells 1 and the M1 interconnects 58 of the terminal cells CE are mutually connected, each forming an M1 power line extending in the X direction. Therefore, the power supply in the X direction can be further strengthened.

Note that, in FIGS. 7A and 7B, the M1 interconnects 51 to 58 may be replaced with multilayered interconnects.

(Alteration 4)

Figure 8:
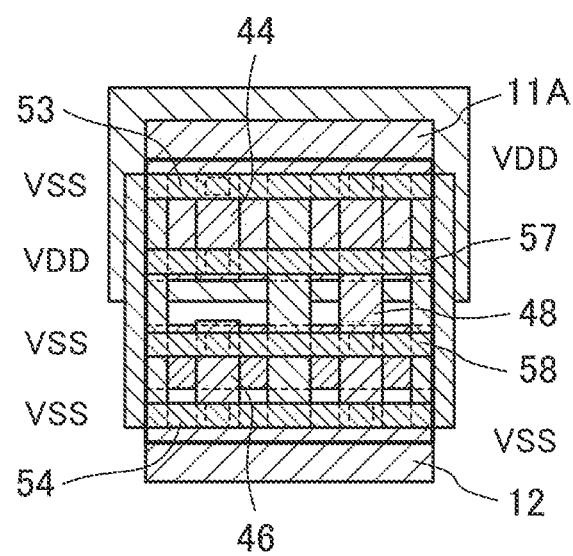
FIG. 8 shows an alteration of the terminal cell.

FIG. 8 shows a further alteration of the terminal cell CE shown in FIG. 7B. In the layout structure of FIG. 8, the M1 interconnect 53 supplies, not VDD, but VSS. A local interconnect 48 extends in the Y direction to overlap the power lines 11A and 12 as viewed in plan, and is connected with the power line 12 but not connected with the power line 11A. The M1 interconnect 53 is connected with the local interconnect 48 through a via but not connected with the local interconnect 44 that is connected with the power line 11A. The M1 interconnect 57 is connected with the local interconnect 44 through a via. The M1 interconnects 54 and 58 are connected with the local interconnects 46 and 48 through vias.

According to the layout structure of FIG. 8, the M1 interconnect 57 supplying VDD and the M1 interconnects 53 and 58 supplying VSS are arranged alternately, whereby interconnect capacitances can be formed between the M1 interconnects. Having such interconnect capacitances, variations in power supply voltage can be reduced.

(Other Alterations)

In the power tap cell in the end row shown in FIGS. 4A-4C, while the local interconnect 46 and the power line 11A are connected through one via, they may be connected through a plurality of vias. Otherwise, they may be connected through a via long in the Y direction.

In the power tap cell 1 and the terminal cell CE, while the dummy gate interconnect is formed to extend over the p-type transistor region AP and the n-type transistor region AN, the dummy gate interconnect may be divided into one in the p-type transistor region AP and one in the n-type transistor region AN.

Second Embodiment

FIG. 9 shows an layout example of a circuit block of a semiconductor integrated circuit device according to the second embodiment. In the layout of FIG. 9, a cell row CRM including double-height cells lining up in the X direction are placed in the center in the Y direction. A thick buried power line 3M extending in the X direction is placed in the center of the cell row CRM in the Y direction. The power line 3M supplies the power supply voltage VDD. The other configuration is similar to the layout of FIG. 1, and therefore common components are denoted by the same characters and detailed description thereof is omitted here in some cases.

Cells CM and power tap cells 1M are arranged in the cell row CRM. The cell width (size in the X direction) of the cells CM is uniform and the same as the cell width of the terminal cells CE. The power tap cells 1M are placed at the same positions as the power tap cells 1 in the other cell rows in the X direction. The M2 power lines 5 are connected with the power line 3M through vias in the power tap cells 1M. With this layout, the power supply is further more strengthened than the case of the layout of FIG. 1.

Figure 10A:
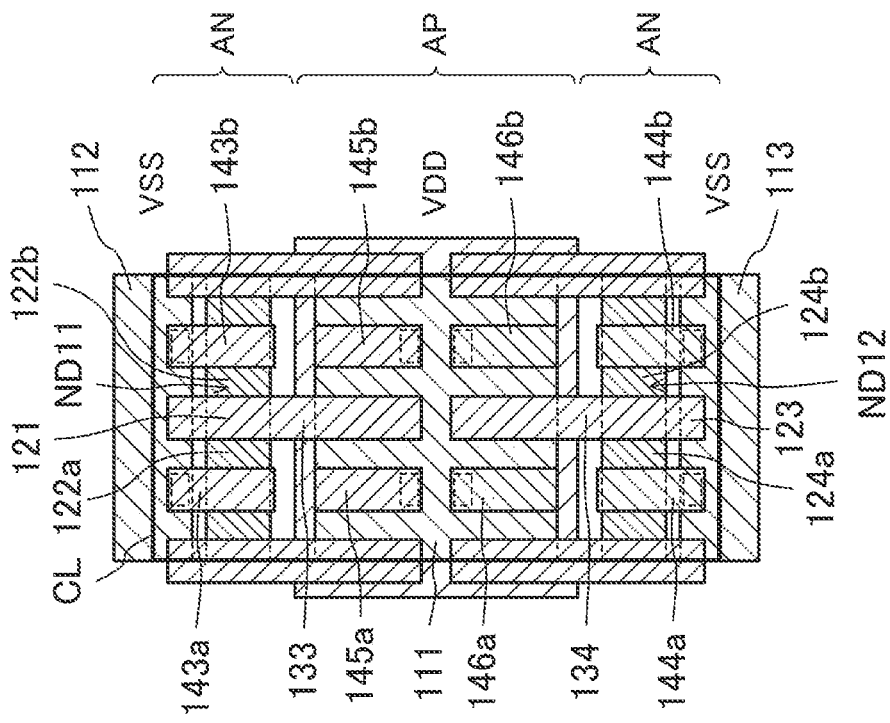
FIG. 10A shows a layout structure example of a power tap cell 1M.
Figure 10B:
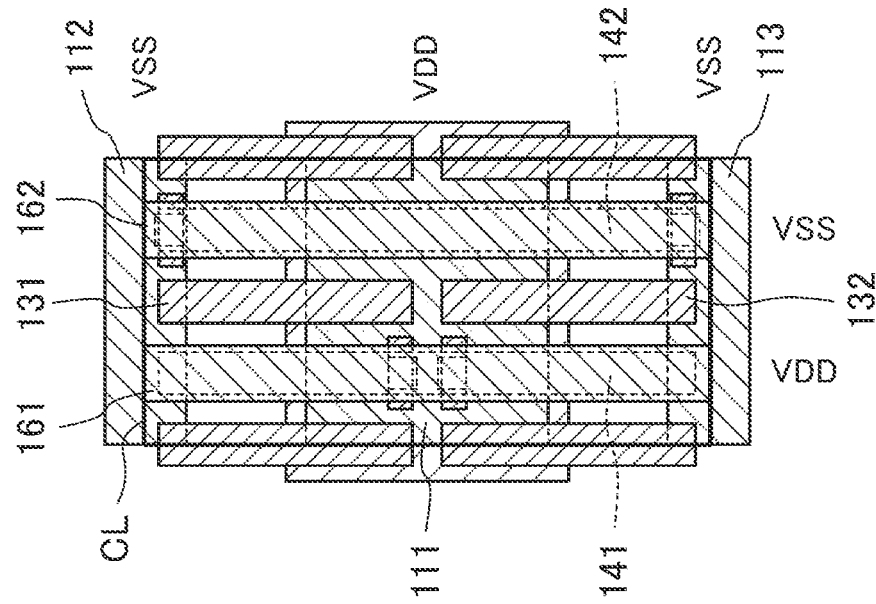
FIG. 10B shows a layout structure example of a cell CM.

FIG. 10A is a plan view showing a layout structure example of the power tap cell 1M in the cell row CRM, and FIG. 10B is a plan view showing a layout structure example of the cell CM in the cell row CRM.

As shown in FIGS. 10A and 10B, a power line 111 extending in the X direction is laid in the center of each of the power tap cell 1M and the cell CM in the Y direction. Also, power lines 112 and 113 extending in the X direction are laid along both ends of each of the power tap cell 1M and the cell CM in the Y direction. The power lines 111, 112, and 113 are all buried power rails (BPRs) formed in the buried interconnect layer. The power line 111 is greater in line width (size in the Y direction) than the power lines 112 and 113. The power line 111 supplies VDD, and the power lines 112 and 113 supply VSS. The power line 111 is shared with other power tap cells 1M and cells CM arranged in the cell row CRM, forming the power line 3M in FIG. 9. The power lines 112 and 113 are shared with other power tap cells 1M and cells CM arranged in the cell row CRM, forming the power lines 4 in FIG. 9.

As shown in FIG. 10A, in the power tap cell 1M, no nanosheet is formed, and thus no transistor is formed. Local interconnects 141 and 142 extending in the Y direction are formed on both sides of gate interconnects 131 and 132, which extend in a line in the Y direction, in the X direction. The local interconnects 141 is connected with the power line 111 through vias, and the local interconnect 142 is connected with the power lines 112 and 113 through vias.

M2 interconnects 161 and 162 extending in the Y direction are formed in a second metal interconnect layer. The M2 interconnect 161 overlaps the local interconnect 141 as viewed in plan and is connected with the local interconnect 141 through vias and an M1 interconnect. The M2 interconnect 162 overlaps the local interconnect 142 as viewed in plan and is connected with the local interconnect 142 through vias and an M1 interconnect. The M2 interconnects 161 and 162 extend up to the cell limits CL in the Y direction.

As shown in FIG. 10B, in the cell CM, n-type dummy transistors ND11 and ND12 are formed in the n-type transistor regions AN on the P-substrate. The dummy transistor ND11 has two nanosheets 121 as a channel portion. At both ends of the nanosheets 121 in the X direction, formed are pads 122*a* and 122*b* each formed of a semiconductor layer of an integral structure connected to the two sheets. The dummy transistor ND12 has two nanosheets 123 as a channel portion. At both ends of the nanosheets 123 in the X direction, formed are pads 124*a* and 124*b* each formed of a semiconductor layer of an integral structure connected to the two sheets. No dummy transistor is formed in the p-type transistor region AP on the N-well.

A gate interconnect 133, extending in the Y direction, surrounds the nanosheets 121 of the dummy transistor ND11 through a gate insulating film (not shown). A gate interconnect 134, extending in the Y direction, surrounds the nanosheets 123 of the dummy transistor ND12 through a gate insulating film (not shown).

Local interconnects 143*a*, 143*b*, 144*a*, and 144*b* extending in the Y direction are formed. The local interconnect 143*a* is connected with the pad 122*a* and also connected with the power line 112 through a via. The local interconnect 143*b* is connected with the pad 122*b* and also connected with the power line 112 through a via. The local interconnect 144*a* is connected with the pad 124*a* and also connected with the power line 113 through a via. The local interconnect 144*b* is connected with the pad 124*b* and also connected with the power line 113 through a via.

Local interconnects 145*a*, 145*b*, 146*a*, and 146*b* extending in the Y direction are formed. The local interconnects 145*a*, 145*b*, 146*a*, and 146*b* are connected with the power line 111 through vias.

As shown in FIG. 10B, in the cell CM, the nanosheets, the pads, the gates, and the local interconnects are formed in its transistor regions closer to the cells C adjacent in the Y direction (i.e., the n-type transistor regions AN in the upper and lower parts in FIG. 10B). With this configuration, it is possible to reduce variations in the finished shape of the layout pattern of the cells C in the cell rows CR, and this can lead to reduction in production variations of semiconductor integrated circuit devices, improvement in yield, and improvement in reliability.

Also, in the cell CM, no dummy transistor including nanosheets and pads is formed in the p-type transistor region AP. Therefore, the buried power line 111 having a large line width can be formed. That is, with no dummy transistor formed in the p-type transistor region AP, it is possible to place the thick buried power line 111 without increasing the cell area. It is therefore possible to strengthen power lines without interfering with achievement of higher integration of the semiconductor integrated circuit. Note that, since the p-type transistor region AP does not adjoin any cells C, the absence of a dummy transistor in this region will not impair the effects of reducing production variations of semiconductor integrated circuit devices, improving the yield, and improving the reliability described above.

As described above, in this embodiment, the double-height cells CM having no logical function are placed in the cell row CRM of the circuit block. The double-height cells CM are adjacent to the cells C having normal logical functions in the Y direction. Each of the double-height cells CM has the dummy transistors ND11 and ND12 opposed to transistors of its adjacent cells C, the buried power lines 112 and 113 supplying VSS, and the buried power line 111 supplying VDD. The buried power lines 112 and 113 are respectively placed on the same sides of the dummy transistors ND11 and ND12 as the transistors of the cells C, and the buried power line 111 is placed on the opposite sides of the dummy transistors ND11 and ND12 from the transistors of the cells C. The size of the buried power line 111 in the Y direction is greater than the size of the buried power lines 112 and 113 in the Y direction. With this configuration, the buried power line 111 can be thickened without increasing the area of the double-height cells CM in the cell row CRM. Therefore, in the semiconductor integrated circuit device using buried power lines, it is possible to strengthen power lines without interfering with achievement of higher integration.

Note that the position where the cell row CRM is placed is not limited to the one shown in FIG. 9: i.e., the cell row CRM may be placed in a position other than the center of the circuit block in the Y direction. Also, a plurality of cell rows CRM may be placed in the circuit block. The power line 3M passing through the cell row CRM may be a line supplying VSS. Moreover, both a cell row CRM through which a power line 3M supplying VDD passes and a cell row CRM through which a power line 3M supplying VSS passes may be placed in the circuit block.

(Alteration 1)

Figure 11A:
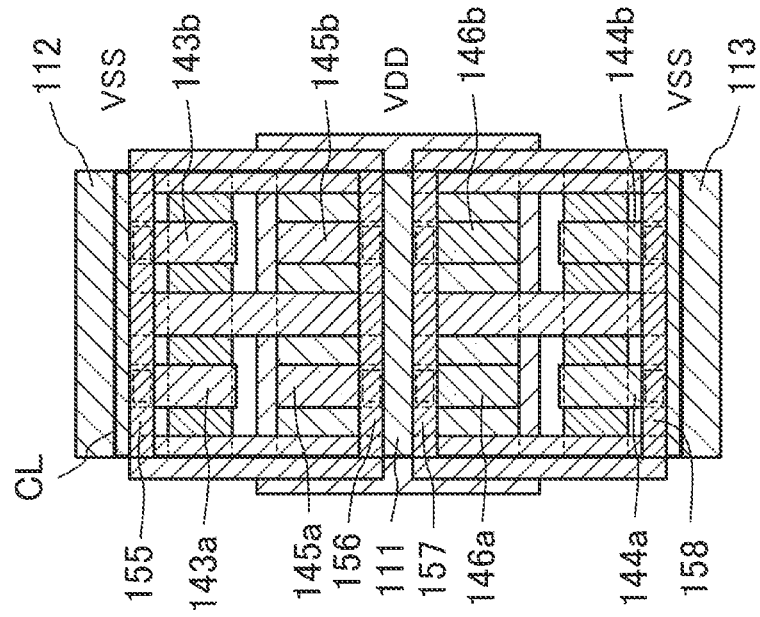
FIG. 11A shows an alteration of the power tap cell 1M.

FIG. 11A shows an alteration of the power tap cell 1M shown in FIG. 10A. In the layout structure of FIG. 11A, the local interconnects 141 and 142 extend up to the cell limits CL. By combining this alteration with Alteration 1 of the first embodiment, in each of the power tap cell groups 2a, 2b, and 2c, local power lines extending in the Y direction are formed. Therefore, since the M2 power lines and the local power lines together form the power line network, the power supply in the Y direction can be strengthened.

Also, in the layout structure of FIG. 11A, M1 interconnects 151, 152, 153, and 154 extend up to the cell limits CL in the X direction. The M1 interconnects 151 and 154 are connected with the power lines 112 and 113 through vias and the local interconnect 142. The M1 interconnects 152 and 153 are connected with the power line 111 through vias and the local interconnect 141. In the layout structure of FIG. 11B, M1 interconnects 155, 156, 157, and 158 extend up to the cell limits CL in the X direction. The M1 interconnect 155 is connected with the power line 112 through vias and the local interconnects 143a and 143b. The M1 interconnect 156 is connected with the power line 111 through vias and the local interconnects 145a and 145b. The M1 interconnect 157 is connected with the power line 111 through vias and the local interconnects 146a and 146b. The M1 interconnect 158 is connected with the power line 113 through vias and the local interconnects 144a and 144b.

Figure 11B:
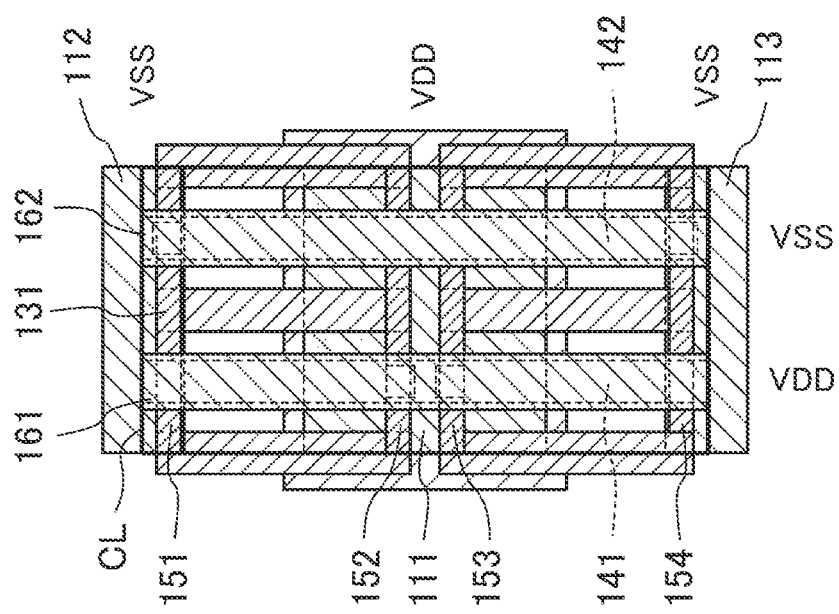
FIG. 11B shows an alteration of the cell CM.

With the alteration of FIGS. 11A and 11B, in the cell row CRM in FIG. 9, the M1 interconnects 151 of the power tap cells 1M and the M1 interconnects 155 of the cells CM are mutually connected, and the M1 interconnects 154 of the power tap cells 1M and the M1 interconnects 158 of the cells CM are mutually connected, each forming an M1 power line supplying VSS extending in the X direction. Also, the M1 interconnects 152 of the power tap cells 1M and the M1 interconnects 156 of the cells CM are mutually connected, and the M1 interconnects 153 of the power tap cells 1M and the M1 interconnects 157 of the cells CM are mutually connected, each forming an M1 power line supplying VDD extending in the X direction. Therefore, since the M1 power lines and the buried power lines together form the power line network, the power supply in the X direction can be strengthened.

Note that, in FIGS. 11A and 11B, the M1 interconnects 151 to 158 may be replaced with multilayered interconnects.

(Alteration 2)

While the cell row CRM constituted by double-height cells is placed for strengthening the power supply in the above embodiment, a cell row constituted by cells greater in cell height than the double-height cells, e.g., triple-height cells may be placed.

Figure 12A:
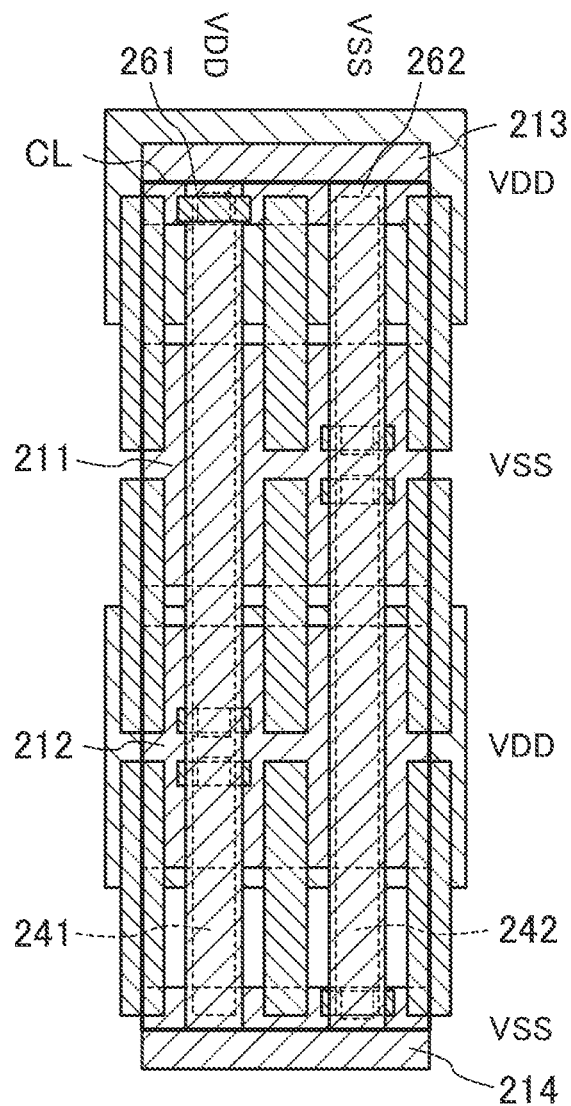
FIGS. 12A-12B show examples of triple-height cells in the second embodiment, where
Figure 12B:
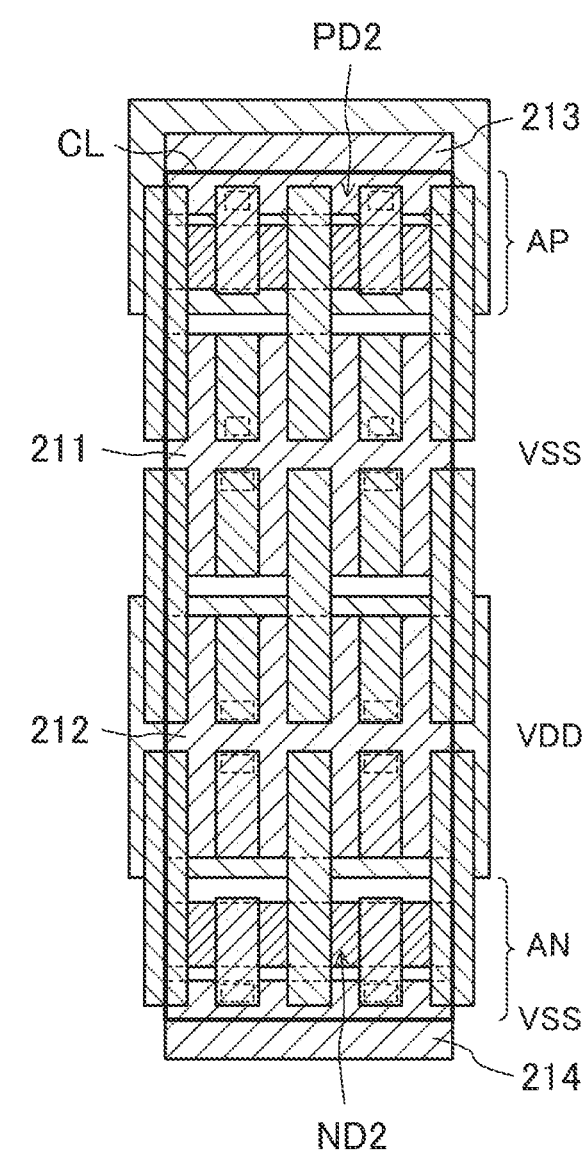

FIGS. 12A-12B show layout structure examples of triple-height cells in this alteration, where FIG. 12A shows a power tap cell and FIG. 12B shows a cell other than the power tap cell. A power line 211 supplying VSS and a power line 212 supplying VDD are placed in the center of each of the cells in the Y direction. A power line 213 supplying VDD and a power line 214 supplying VSS are placed along both ends of each of the cells in the Y direction. The power lines 211 to 214 are formed in the buried interconnect layer. The power lines 211 and 212 are greater in line width (size in the Y direction) than the power lines 213 and 214.

As shown in FIG. 12A, in the power tap cell, a local interconnect 241 is connected to the power lines 212 and 213 through vias, and an M2 interconnect 261 is connected to the local interconnect 241 through vias and an M1 interconnect. A local interconnect 242 is connected to the power lines 211 and 214 through vias, and an M2 interconnect 262 is connected to the local interconnect 242 through vias and an M1 interconnect.

As shown in FIG. 12B, in the other cell, a p-type dummy transistor PD2 is formed in the p-type transistor region AP on the N-well in the upper part in the figure, and an n-type dummy transistor ND2 is formed in the n-type transistor region AN on the P-substrate in the lower part in the figure. No dummy transistor is formed in the transistor regions in the center in the Y direction.

With the cell row constituted by triple-height cells as shown in FIGS. 12A-12B placed in the circuit block, it is possible to increase the line width of buried power lines supplying VDD and buried power lines supplying VSS. This can strengthen the power supply, and also the efficiency of cell placement for strengthening the power supply becomes high compared with the case of placing a cell row constituted by double-height cells.

OTHER EMBODIMENTS

While the buried power lines 3A and 3B along the upper and lower ends of the circuit block supply VDD in the above embodiments, they may supply VSS instead.

In this case, in the layout structure of the terminal cell CE shown in FIGS. 5A-5C, the power line 12 supplying VSS may be made thick and the power line 11A supplying VDD may be made thin. No dummy transistor may be formed in the n-type transistor region on the P-substrate, and a p-type dummy transistor may be formed in the p-type transistor region on the N-well. Also, in the layout structure of the power tap cell 1 shown in FIGS. 4A-4C, the power line 12 supplying VSS may be made thick and the power line 11A supplying VDD may be made thin. Such terminal cells CE and power tap cells 1 may be vertically inverted and placed in the uppermost cell row CRA of the circuit block, and placed in the lowermost cell row CRB without vertical inversion.

The power line along the upper end of the circuit block and the power line along the lower end of the circuit block may supply different power supply voltages from each other. In this case, the terminal cells CE and the power tap cells 1 placed in the uppermost cell row CRA of the circuit block may be different in layout structure from those placed in the lowermost cell row CRB.

While the power lines extending in the Y direction in the power tap cells 1 are M2 interconnects in the above embodiments, the configuration is not limited to this. They may be metal interconnects in an interconnect layer other than the M2 interconnect layer, or metal interconnects formed in a plurality of interconnect layers.

In the above embodiments, it is not necessarily required to place the power tap groups at equal spacing in the X direction. For example, in a region where more strengthened power supply is desired, the power tap cell groups may be placed at a spacing narrower than in the other regions. That is, the power tap cell groups may just be placed at given spacings in the X direction.

While the transistors formed in the cells are nanosheet FETs in the above embodiments, the transistors are not limited to this type, but may be fin transistors, for example. Also, while each of the nanosheet FETs of the cells has two nanosheets, the number of nanosheets is not limited to two.

The width (size in the X direction) of the power tap cell is not limited to the one shown in the above embodiments. For example, the width of the power tap cells may be made large enough to place two M2 interconnects supplying VDD and two M2 interconnects supplying VSS. Also, only one M2 power line may be placed to reduce the width of the power tap cell, or three or more M2 power lines may be placed in parallel to increase the width of the power tap cell.

According to the present disclosure, in a semiconductor integrated circuit device using buried power lines, it is possible to strengthen power lines without interfering with achievement of higher integration. The present disclosure is therefore useful for improvement of the performance of semiconductor chips, for example.

What is claimed is:

1. A semiconductor integrated circuit device comprising a plurality of cell rows each including standard cells lining up in a first direction, the cell rows being arranged in a second direction perpendicular to the first direction,
   wherein
   the plurality of cell rows include
      a first standard cell having a logical function placed in a first cell row, the first cell row being a row located second from an end row in the second direction, and
      a second standard cell having no logical function placed in a second cell row, the second cell row being the end row in the second direction and adjoining the first cell row, the second standard cell being adjacent to the first standard cell in the second direction,
   the first standard cell includes
      a first region in which a transistor of a first conductivity type is formed,
      a second region in which a transistor of a second conductivity type is formed,
      a first transistor of the first conductivity type formed in the first region, a second transistor of the second conductivity type formed in the second region,
      a first buried power line supplying a first power supply voltage, formed in a buried interconnect layer, and
      a second buried power line supplying a second power supply voltage, formed in the buried interconnect layer,
   the second standard cell includes
      a third region in which a transistor of the second conductivity type is formed,
      a third transistor of the second conductivity type formed in the third region, opposed to the second transistor in the second direction,
      a third buried power line supplying the second power supply voltage, formed in the buried interconnect layer and placed on a same side of the third transistor as the second transistor, and
      a fourth buried power line supplying the first power supply voltage, formed in the buried interconnect layer and placed on an opposite side of the third transistor from the second transistor, and
   the size of the fourth buried power line in the second direction is greater than the size of the third buried power line in the second direction.

2. The semiconductor integrated circuit device of claim 1, wherein
   the second standard cell includes
      a first metal interconnect formed in a metal interconnect layer, extending in the first direction, overlapping the fourth buried power line as viewed in plan, and electrically connected with the fourth buried power line.

3. The semiconductor integrated circuit device of claim 2, wherein
   the second standard cell includes
      a second metal interconnect formed in the metal interconnect layer, extending in the first direction, overlapping the fourth buried power line as viewed in plan, and supplying the second power supply voltage.

4. The semiconductor integrated circuit device of claim 1, comprising
   a power tap cell group comprising a plurality of power tap cells lining up in the second direction, each of the power tap cells being provided in each of the plurality of cell rows, wherein the power tap cell group includes
 a first metal power line supplying the first power supply voltage, formed in a metal interconnect layer and extending in the second direction, and
 a second metal power line supplying the second power supply voltage, formed in the metal interconnect layer and extending in the second direction.

5. The semiconductor integrated circuit device of claim 4, wherein
the power tap cell group includes
 a first local power line supplying the first power supply voltage, formed in a local interconnect layer in which local interconnects in contact with sources and drains of transistors of standard cells are formed, extending in the second direction, and overlapping the first metal power line as viewed in plan, and
 a second local power line supplying the second power supply voltage, formed in the local interconnect layer, extending in the second direction, and overlapping the second metal power line as viewed in plan.

6. A semiconductor integrated circuit device comprising a plurality of cell rows each including standard cells lining up in a first direction, the cell rows being arranged in a second direction perpendicular to the first direction,
wherein
the plurality of cell rows include
 a first standard cell having a logical function placed in a first cell row, and
 a second standard cell, which is a multi-height cell, having no logical function placed in a second cell row adjoining the first cell row, the second standard cell being adjacent to the first standard cell in the second direction,
the first standard cell includes
 a first region in which a transistor of a first conductivity type is formed,
 a second region in which a transistor of a second conductivity type is formed,
 a first transistor of the first conductivity type formed in the first region,
 a second transistor of the second conductivity type formed in the second region,
 a first buried power line supplying a first power supply voltage, formed in a buried interconnect layer, and
 a second buried power line supplying a second power supply voltage, formed in the buried interconnect layer,
the second standard cell includes a third region in which a transistor of the second conductivity type is formed,
 a third transistor of the second conductivity type formed in the third region, opposed to the second transistor in the second direction,
 a third buried power line supplying the second power supply voltage, formed in the buried interconnect layer and placed on a same side of the third transistor as the second transistor, and
 a fourth buried power line supplying the first power supply voltage, formed in the buried interconnect layer and placed on an opposite side of the third transistor from the second transistor, and
the size of the fourth buried power line in the second direction is greater than the size of the third buried power line in the second direction.

7. The semiconductor integrated circuit device of claim 6, wherein
the second standard cell includes
 a fifth buried power line supplying the second power supply voltage, formed in the buried interconnect layer and placed on an opposite side of the fourth buried power line from the second transistor, and
the size of the fifth buried power line in the second direction is greater than the size of the third buried power line in the second direction.

8. The semiconductor integrated circuit device of claim 6, wherein
the second standard cell includes
 a first metal interconnect formed in a metal interconnect layer, extending in the first direction, overlapping the fourth buried power line as viewed in plan, and electrically connected with the fourth buried power line.

9. The semiconductor integrated circuit device of claim 6, comprising
a power tap cell group comprising a plurality of power tap cells lining up in the second direction, each of the power tap cells being provided in each of the plurality of cell rows,
wherein
the power tap cell group includes
 a first metal power line supplying the first power supply voltage, formed in a metal interconnect layer and extending in the second direction, and
 a second metal power line supplying the second power supply voltage, formed in the metal interconnect layer and extending in the second direction.

10. The semiconductor integrated circuit device of claim 9, wherein
the power tap cell group includes
 a first local power line supplying the first power supply voltage, formed in a local interconnect layer in which local interconnects in contact with sources and drains of transistors of standard cells are formed, extending in the second direction, and overlapping the first metal power line as viewed in plan, and
 a second local power line supplying the second power supply voltage, formed in the local interconnect layer, extending in the second direction, and overlapping the second metal power line as viewed in plan.

* * * * *